United States Patent [19]

Nagano

[11] Patent Number: 4,529,893
[45] Date of Patent: Jul. 16, 1985

[54] VOLTAGE COMPARATOR CIRCUIT

[75] Inventor: Katsumi Nagano, Shimonoseki, Japan

[73] Assignee: Tokyo Shibaura Denki Kabushiki Kaisha, Japan

[21] Appl. No.: 497,131

[22] Filed: May 23, 1983

[30] Foreign Application Priority Data

May 27, 1982 [JP] Japan .................................. 57-90061

[51] Int. Cl.³ ........................................... H03K 5/153
[52] U.S. Cl. .................... 307/361; 307/261; 307/494
[58] Field of Search .............. 307/261, 350, 360, 361, 307/494, 299 A

[56] References Cited

U.S. PATENT DOCUMENTS

| 3,649,846 | 3/1972 | Frederiksen | 307/235 |
| 4,177,394 | 12/1979 | Takasugi | 307/360 |
| 4,270,118 | 5/1981 | Brokaw | 307/361 |
| 4,300,063 | 11/1981 | Dunphy et al. | 307/355 |

FOREIGN PATENT DOCUMENTS 3119923 2/1982 Fed. Rep. of Germany .
2034551 4/1980 United Kingdom .

Primary Examiner—John Zazworsky
Attorney, Agent, or Firm—Finnegan, Henderson, Farabow, Garrett & Dunner

[57] ABSTRACT

An odd-number of pairs of differential transistors are provided. Each transistor of any pair has one control electrode and first and second terminals. An input voltage is applied to the control electrode of one of the transistors of each pair. A reference voltage is applied to the control electrode of the other transistors of each pair. The first terminals of the transistors of each pair are connected to each other, forming a node. A first load circuit is connected to the second terminal of the transistors of each odd-numbered pair whose control electrodes are connected to receive the input voltage and to the second terminal of the transistor of each even-numbered pair whose control electrode is connected to receive a reference voltage. A second load circuit is connected to the second terminal of the transistor of each even-numbered pair whose control electrode is connected to receive the input voltage and to the second terminal of the transistors of each odd-numbered pair whose control electrodes are connected to receive a reference voltage. An output transistor is driven by an output delivered from the second terminal of any transistor which is connected to the second load circuit.

4 Claims, 10 Drawing Figures

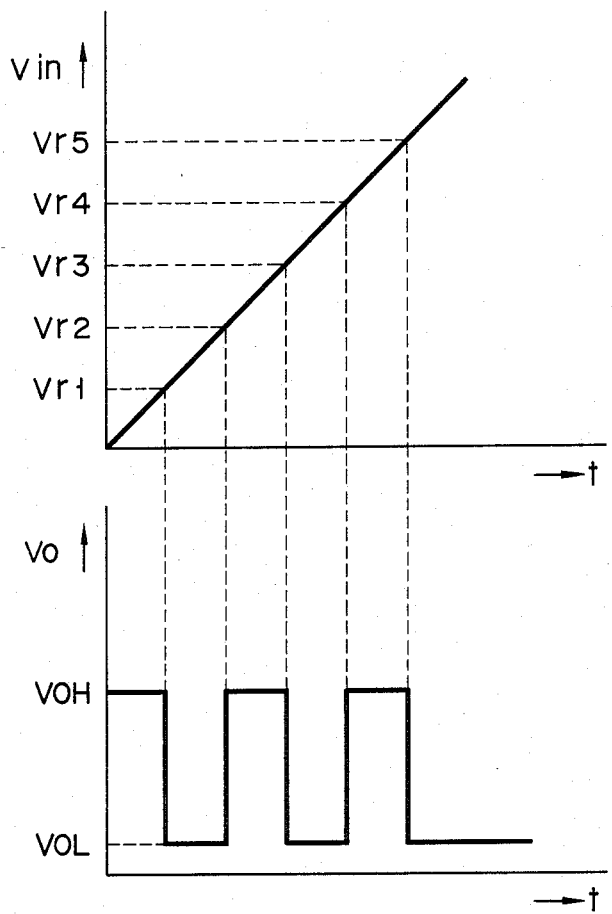
F I G. 9

VOLTAGE COMPARATOR CIRCUIT

BACKGROUND OF THE INVENTION

The present invention relates to a voltage comparator circuit and, more particularly, to a voltage comparator circuit formed in a bipolar integrated circuit.

A conventional voltage comparator circuit is known which uses a set of differential paired transistors as disclosed in U.S. Pat. No. 3,649,846 issued to T. M. Frederiksen, et al. and assigned to Motorola. A conventional window comparator circuit is also known which uses two sets of differential paired transistors as disclosed in U.S. patent application Ser. No. 262,498 assigned to the present applicant. The former voltage comparator circuit uses only a single inverting (threshold) voltage, while the latter window comparator circuit has two inverting voltages. However, the conventional comparator circuits having one or two inverting voltages cannot be used in a variety of applications.

SUMMARY OF THE INVENTION

It is, therefore, an object of the present invention to provide a voltage comparator circuit which has an odd number (3 or greater) of inverting voltages, performs a logic function as an inverter as a whole, operates stably with a single output, and which may be applied in various fields.

According to an aspect of the present invention, there is provided a voltage comparator circuit comprising: an input terminal for receiving an input voltage; an odd-number of reference voltage terminals for receiving an odd-number of different reference voltages; and odd-number of pairs of differential transistors each having one control electrode and first and second terminals, the control electrodes of the differential transistors of each pair being connected to the input terminal and the corresponding voltage reference voltage terminal and the first terminals of the differential transistors of each pair being connected to each other, forming a node; an odd-number of constant current sources provided for the pairs of differential transistors, respectively, each of the constant current sources being connected to the node of the differential transistors of the corresponding pair; a first load circuit connected to the second terminal of the differential transistor of each odd-numbered pair whose control electrode is connected to the input terminal and the second terminal of the differential transistor of each even-numbered pair whose control electrode is connected to the corresponding reference voltage terminal; a second load circuit connected to the second terminal of the differential transistor of each even-numbered pair whose control electrode is connected to the input terminal and the second terminal of the differential transistor of each odd-numbered pair whose control electrode is connected to the corresponding reference voltage terminal; and an output transistor which is connected to the second load circuit and is driven by an output delivered from the second terminal of any differential transistor which is connected to the second load circuit.

With a voltage comparator circuit of this configuration, the output voltage is inverted every time the input voltage exceeds inverting voltages which are determined by an odd number of reference voltages. Thus, the voltage comparator circuit as a whole performs a logic function as an inverter, operates stably with a single output, and is applicable in a wide variety of fields.

BRIEF DESCRIPTION OF THE DRAWINGS

FIG. 9 is a graph showing input/output transmission characteristics of the circuit shown in FIG. 8.

DETAILED DESCRIPTION OF THE PREFERRED EMBODIMENTS

Figure 1:
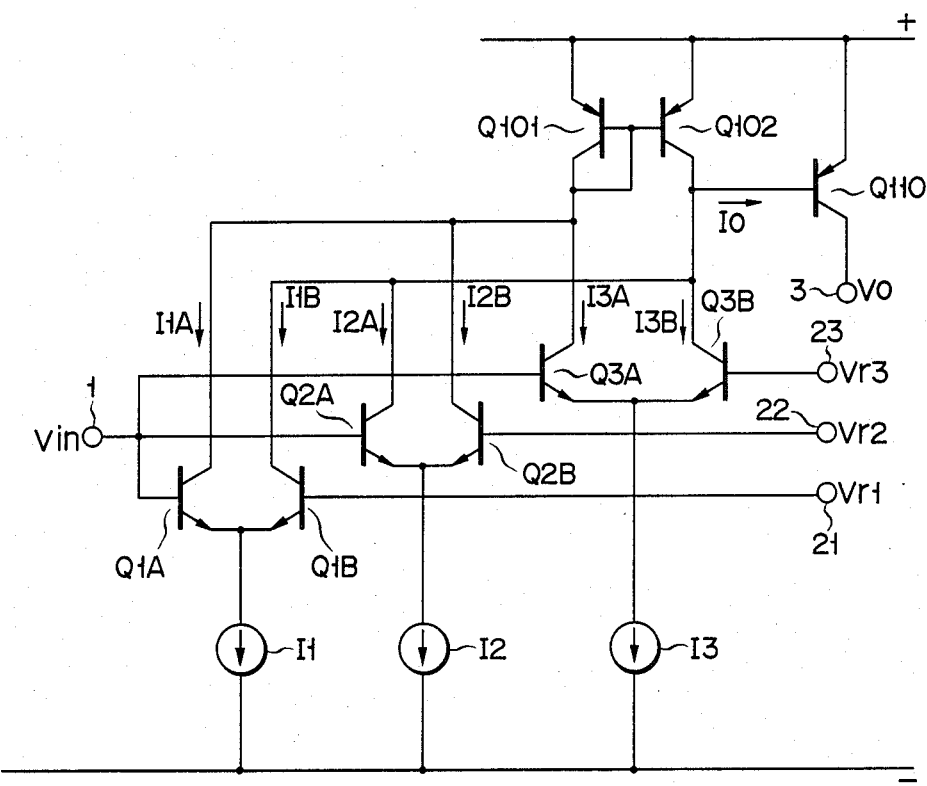
FIG. 1 is a circuit diagram of a voltage comparator circuit of npn transistor input type having three inverting voltage levels in accordance with an embodiment of the present invention.

FIG. 1 shows a voltage comparator circuit in accordance with an embodiment of the present invention. Referring to FIG. 1, symbol + denotes a first power source, while − denotes a second power source. An odd number (e.g., 3) of sets of differential paired transistors (Q1A, Q1B), (Q2A, Q2B) and (Q3A, Q3B), and their constant current sources I1, I2 and I3 together constitute an input circuit. Transistors Q101 and Q102 constitute a current mirror circuit and serve as an active load circuit. An output from the input circuit controls the switching operation of an output transistor Q110.

The base of one transistor Q1A, Q2A or Q3A of each set is commonly connected to a common signal input terminal 1. The base of the other Q1B, Q2B or Q3B of each set is connected to a reference voltage input terminal 21, 22 or 23, respectively. The collectors of the transistors Q1A and Q3A at the input voltage side of the odd-numbered sets, and the collector of the transistor Q2B at the reference voltage side of the even-numbered set are commonly connected to the output end of the transistor Q101 at the primary side of the current mirror circuit. The collector of the transistor Q2A at the input voltage side of the even-numbered transistor, and the collectors of the transistors Q1B and Q3B at the reference voltage side of the odd-numbered sets are commonly connected to the output end of the transistor Q102 at the secondary side of the current mirror circuit.

An input voltage Vin is supplied to the signal input terminal 1, and reference voltages Vr1, Vr2, and Vr3

(where Vr1<Vr2<Vr3) are applied to the reference voltage input terminals 21, 22 and 23, respectively. An output voltage Vo is produced from a signal output terminal 3. Currents I1A and I1B flow in the differential paired transistors Q1A and Q1B, currents I2A and I2B flow in the differential paired transistors Q2A and Q2B, and currents I3A and I3B flow in the differential paired transistors Q3A and Q3B. Currents I1 to I3 are supplied from the constant current sources I1 to I3, and an output current Io flows from the input circuit to the base of the output transistor Q110.

Figure 2:
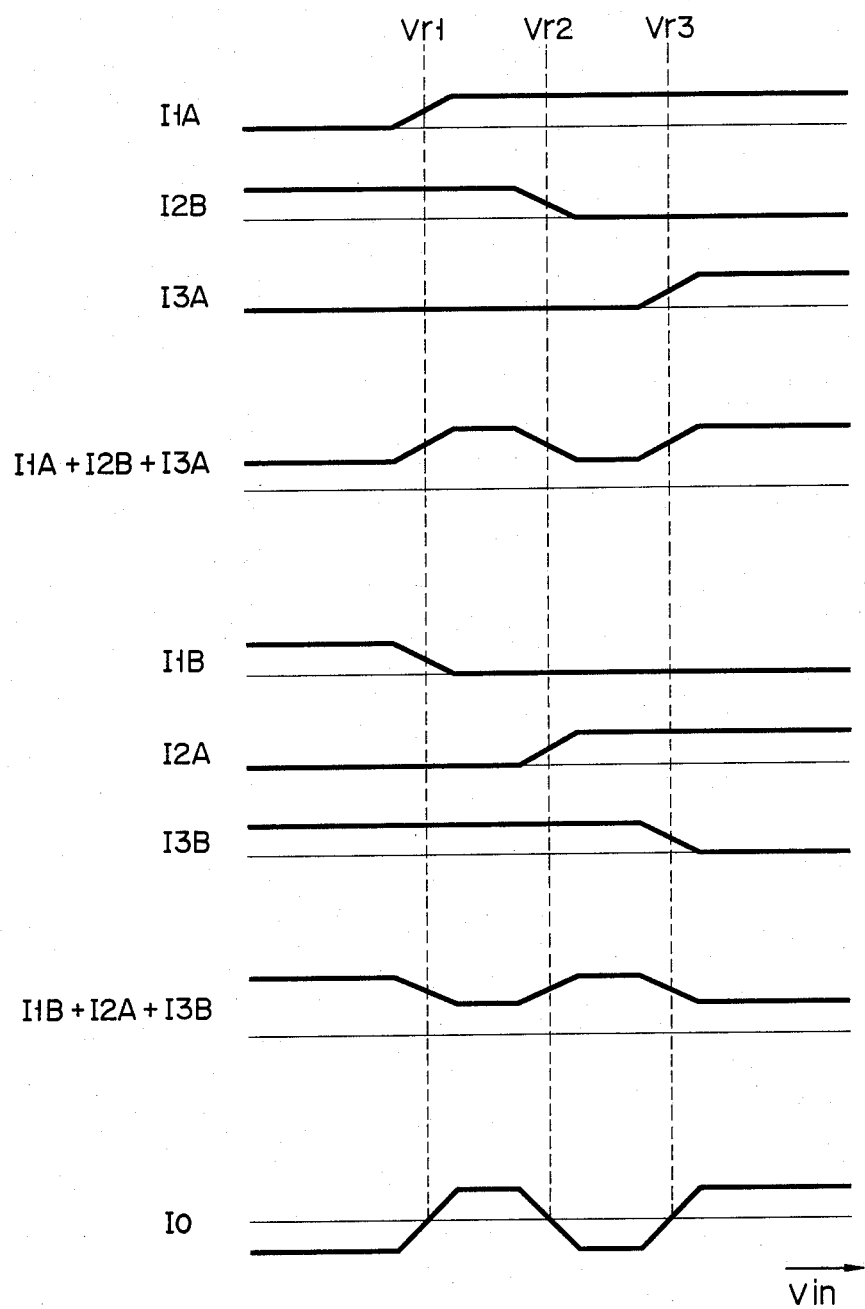
FIG. 2 is a chart showing input voltage vs current characteristics of the circuit shown in FIG. 1.

FIG. 2 shows the relationship between the input voltage Vin and currents at the respective parts of the circuit shown in FIG. 1. The mode of operation of the circuit shown in FIG. 1 will now be described with reference to FIG. 2. When the input voltage Vin is lower than the reference voltage Vr1, the transistors Q1A, Q2A and Q3A are OFF, while the transistors Q1A, Q2B and Q3B are ON. In this state, the currents I1B (=I1), I2B (=I2) and I3B (=I3) flow. When the input voltage Vin satisfies the relation Vr1<Vin<Vr2, the transistor Q1B is turned off, the transistor Q1A is turned ON, and the current I1A (=I1) flows. When the input voltage satisfies Vr2<Vin<Vr3, the transistor Q2B is turned off, the transistor Q2A is turned on, and the current I2A (=I2) flows. When the input voltage Vin becomes higher than the reference voltage Vr3, the transistors Q1B, Q2B and Q3B are OFF while the transistors Q1A, Q2A and Q3A are ON. Thus, the currents I1A, I2A and I3A (=I3) flow.

Assume that the differential paired transistors have a common current amplification factor $\alpha$, $\alpha \simeq 1$ when their bases are grounded, and that the current transmission ratio between the transistors Q101 and Q102 of the active load circuit is "1". The output current Io is then given by equation (1) below:

$$Io = (I1A + I2B + I3A) - (I1B + I2A + I3B) \quad (1)$$

In equation (1), the currents (I1A, I1B), (I2A, I2B) and (I3A, I3B) are inverted when the input voltage Vin exceeds the reference voltages Vr1, Vr2 and Vr3, respectively. Therefore, if the currents I1 to I3 are set to be equal to each other, the output current Io and an output voltage Vo are inverted when the input voltage exceeds the reference voltages Vr1, Vr2 and Vr3, respectively.

The relationship between the input voltage Vin, the reference voltages Vr1, Vr2 and Vr3, and the output voltage Vo is summarized as follows:

(1) If Vin<Vr1, the output current Io is negative. Therefore, the output transistor Q110 is turned on, and the output voltage Vo becomes high level "H" or Voh (substantially equal to the potential of the first power source).

(2) If Vr1<Vin<Vr2, the output current Io is positive. Therefore, the output transistor Q110 is turned off, and the output voltage Vo becomes level "L" or Vol.

(3) If Vr2<Vin<Vr3, the output current Io is negative. The output transistor Q110 is turned on, and the output voltage Vo becomes high level "H" or Voh.

(4) If Vr3<Vin, the output current Io is positive. The output transistor Q110 is turned on, and the output voltage Vo becomes low level "1" or Vol.

The level "H" or "L" of the output voltage Vo is determined in accordance with the four conditions described above.

In this manner, the voltage comparator circuit shown in FIG. 1 has an odd number (i.e., 3) of inverting voltages. The comparator circuit performs a logic function as a whole and operates stably with a single output. This also applies to a conventional voltage comparator circuit (with one inverting voltage) and, therefore, the mode of operation of an inverter having an odd number of inverting voltages provides the general principle of operation of voltage comparator circuits.

Figure 3:
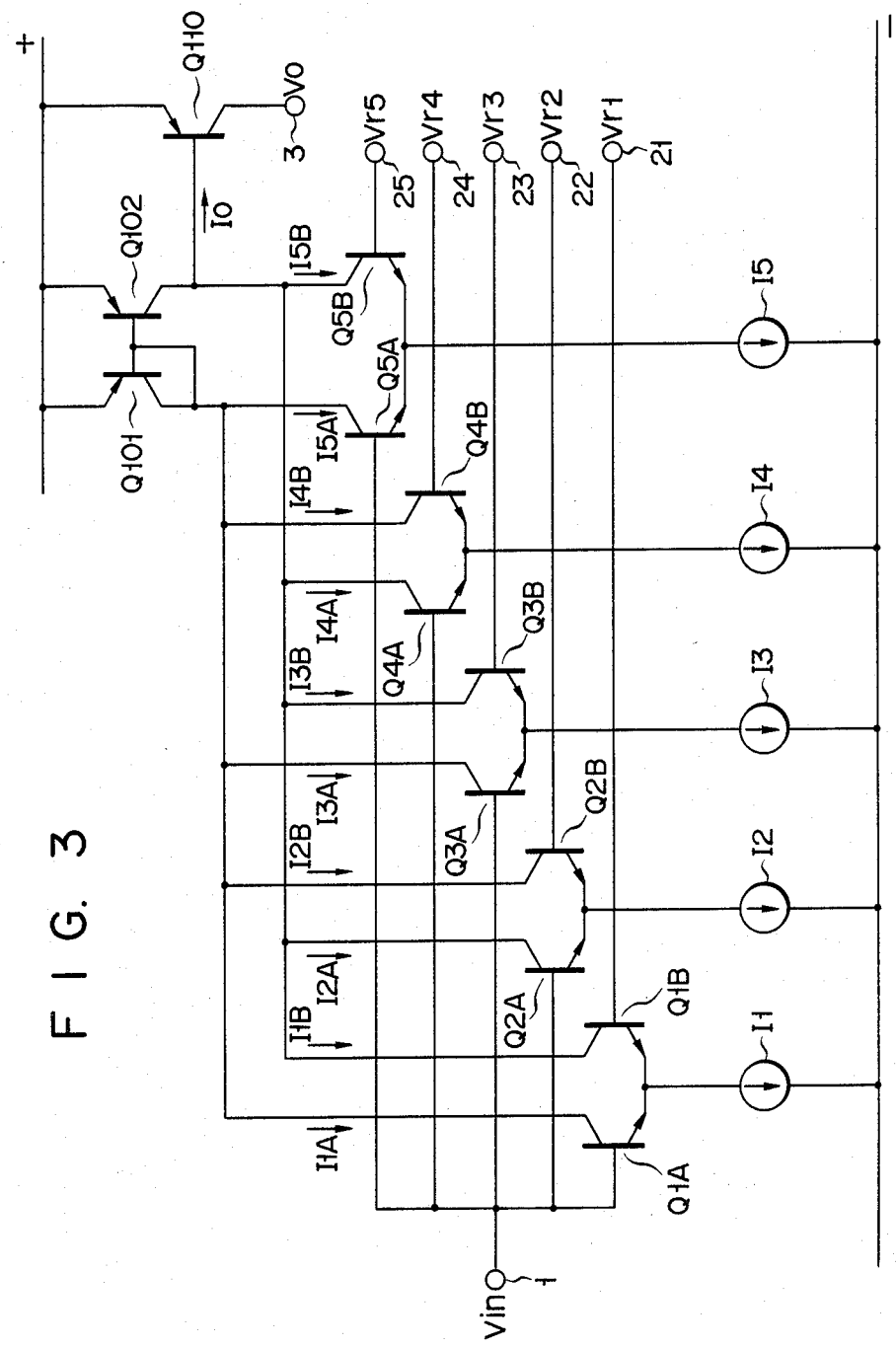
FIG. 3 is a circuit diagram of a voltage comparator circuit of npn transistor input type having 5 inverting voltage levels in accordance with another embodiment of the present invention.

FIG. 3 shows another embodiment of the present invention. The circuit has two more sets of differential paired transistors (Q4A, Q4B) and (Q5A, Q5B) and their constant current sources I4 and I5 in addition to those shown in FIG. 1. The bases of the transistors Q4A and Q5A are connected to a common signal input terminal 1, and the transistors Q4B and Q5B are connected to reference voltage input terminals 24 and 25, respectively. Reference voltages Vr4 and Vr5 (where Vr5>Vr4>Vr3) are applied to the reference voltage input terminals 24 and 25, respectively. The circuit shown in FIG. 3 has 5 inverting voltages.

Figure 4:
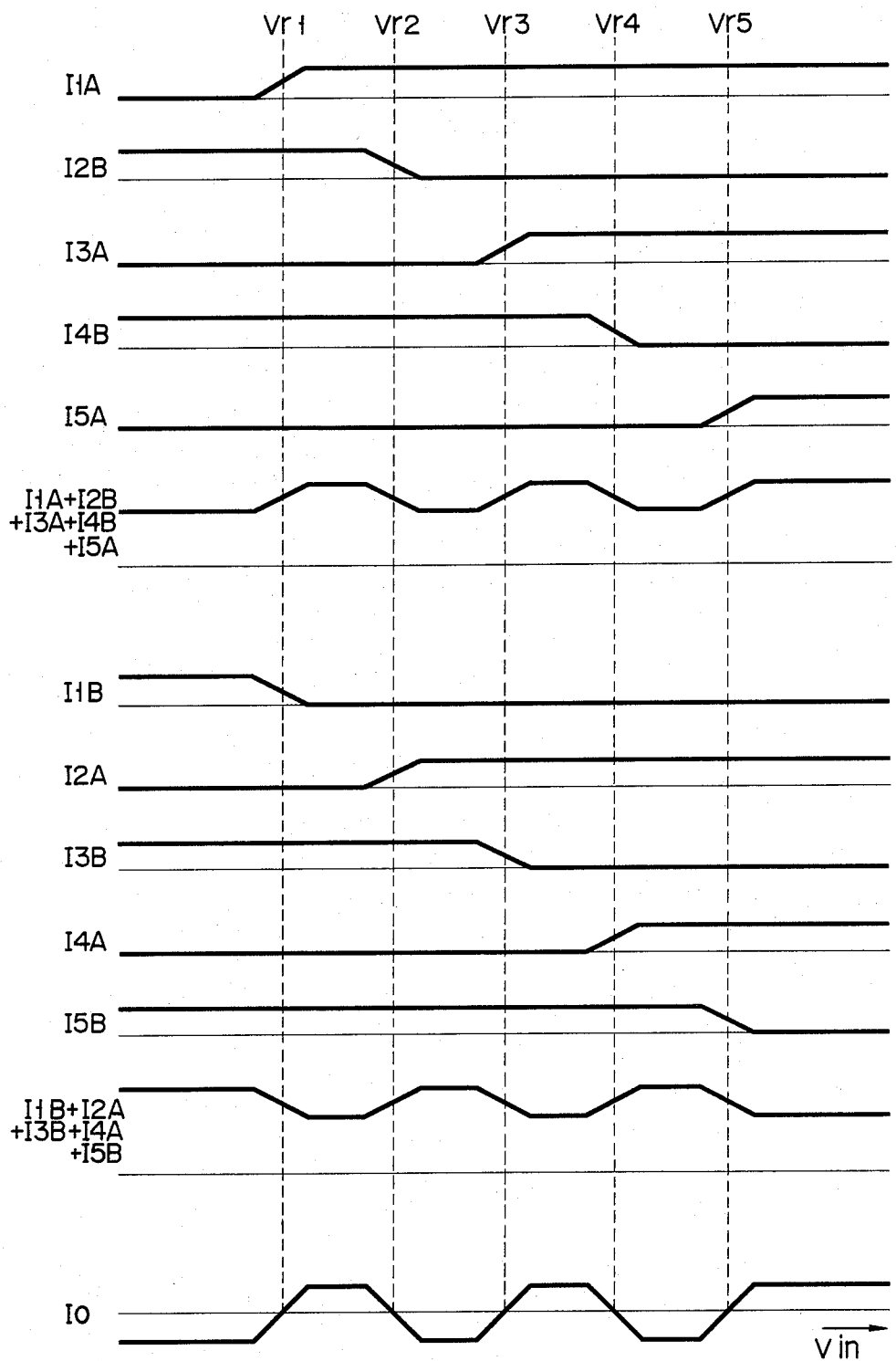
FIG. 4 is a chart showing input voltage vs current characteristics of the circuit shown in FIG. 3.

FIG. 4 shows the input voltage Vin and the currents at the respective parts of the circuit shown in FIG. 3. The output voltage Vo may be kept at one of the following levels in accordance with the 6 different states of the input voltage Vin:

(1) level "H" if Vin<Vr1, Vr2<Vin<Vr3, and Vr4<Vin<Vr5, and (2) level "L" if Vr1<Vin<Vr2, Vr3<Vin<Vr4 and Vr5<Vin.

In this manner, the circuit having 5 inverting voltages functions in a manner similar to that of the circuit having 3 inverting voltages as shown in FIG. 1. The mode of operation of the circuit having 5 inverting voltages may be discussed in accordance with the general principle described above.

Figure 5:
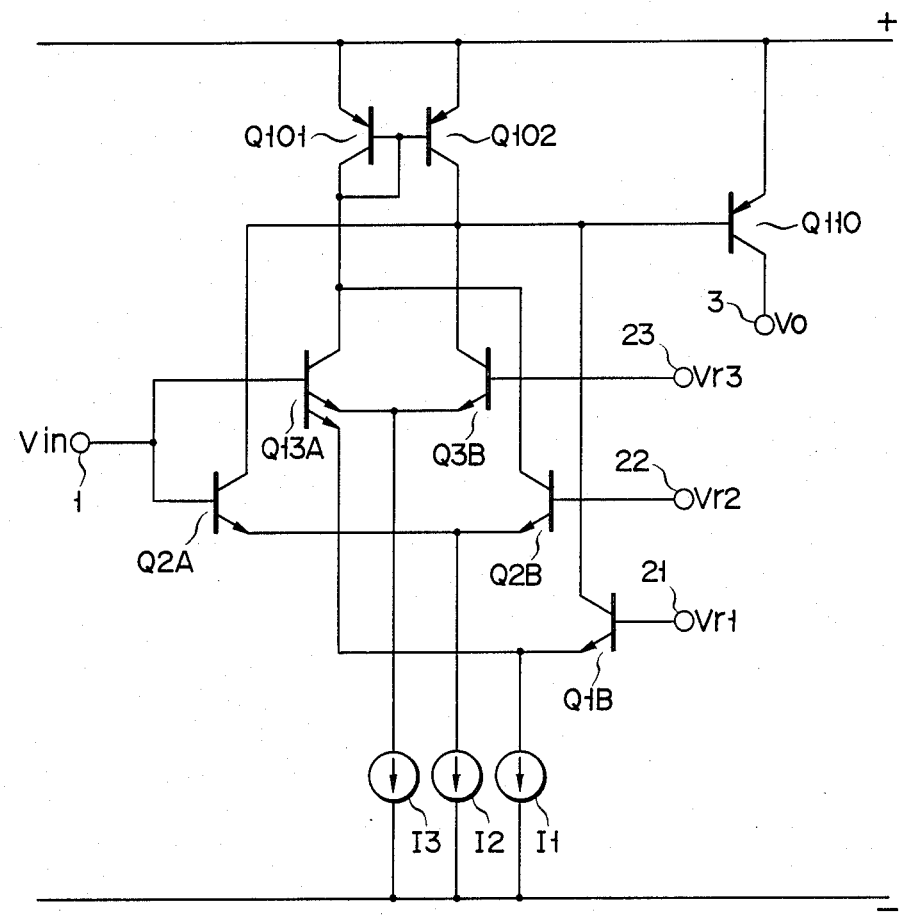
FIG. 5 is a circuit diagram of a voltage comparator circuit of multiemitter transistor input type having 3 inverting voltage levels in accordance with still another embodiment of the present invention.

FIG. 5 shows still another embodiment wherein a multiemitter transistor Q13A replaces the transistors Q3A and Q3B shown in FIG. 1, the collectors of which are commonly connected and the bases of which are also commonly connected. The same reference numerals in FIG. 5 denote the same parts in FIG. 1, and a detailed description thereof will be omitted. With the circuit of this configuration, the number of input side transistors can be reduced to half.

Figure 6:
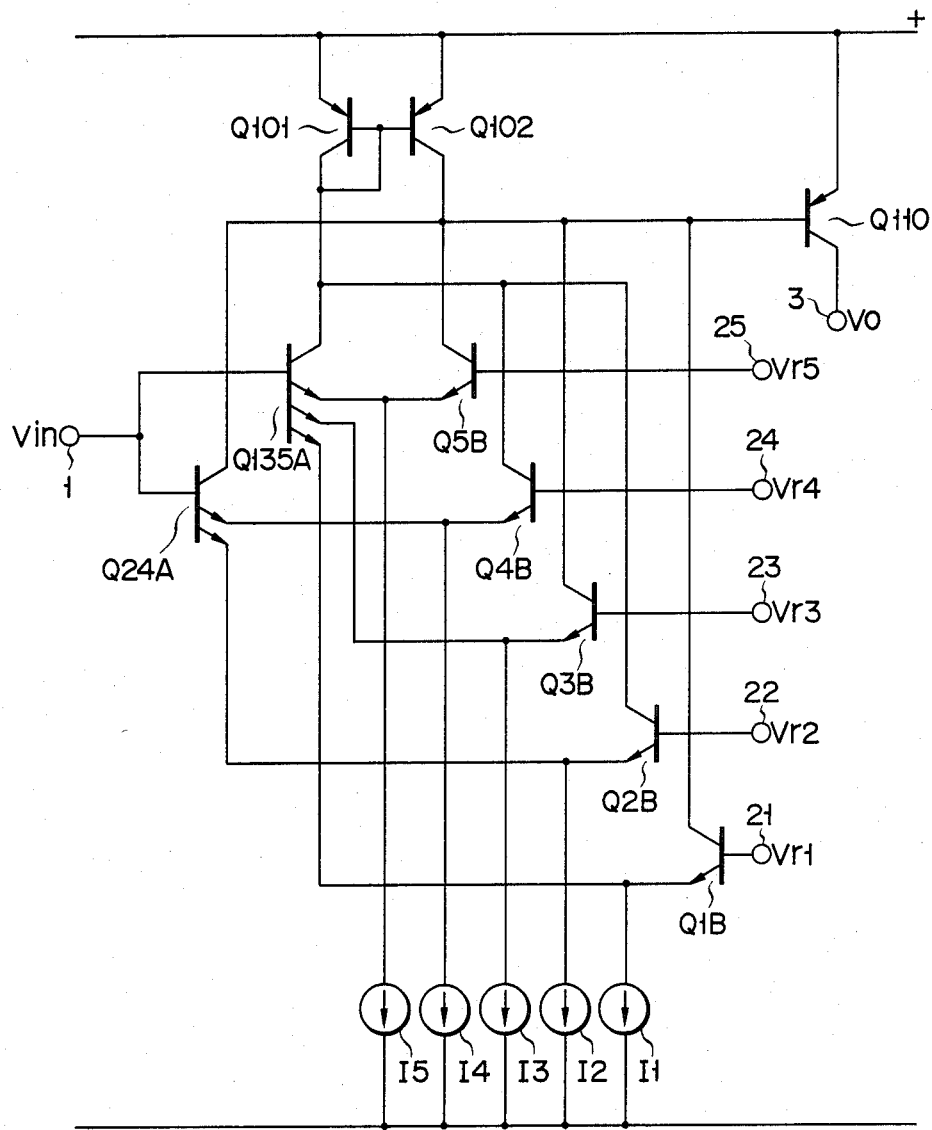
FIG. 6 is a circuit diagram of a voltage comparator circuit of multiemitter transistor input type having 5 inverting voltage levels in accordance with still another embodiment of the present invention.

FIG. 6 shows still another embodiment of the present invention wherein a multiemitter transistor Q135A replaces the transistors Q1A, Q3A and Q5A, the collectors of which are commonly connected, and the bases of which are commonly connected, and a multiemitter transistor Q24A replaces the transistors Q2A and Q4A, the collectors and bases of which are commonly connected. With the circuit of this configuration, only two input voltage side transistors are required as compared to 5 transistors used in the circuit shown in FIG. 3.

In the respective embodiments described above, the differential paired transistors are of npn-type, while the transistors of the current mirror circuit and the output transistor are of pnp-type. However, the polarities of the transistors and of the power sources may be inverted. For example, if the polarities of the circuit as shown in FIG. 1 are inverted, a voltage comparator circuit as shown in FIG. 7 is obtained.

Figure 7:
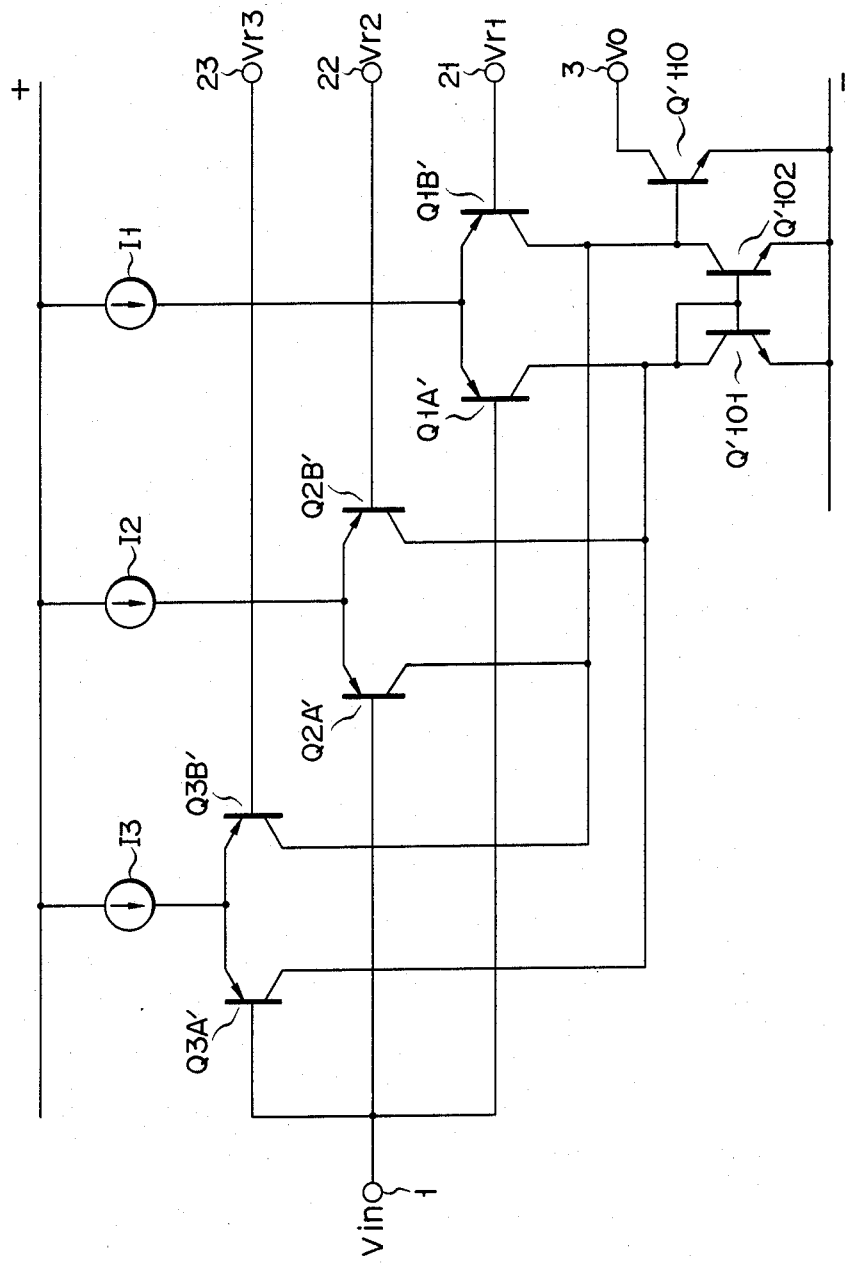
FIG. 7 is a circuit diagram of a voltage comparator circuit of pnp transistor input type having 3 inverting voltage levels in accordance with still another embodiment of the present invention.
Figure 8:
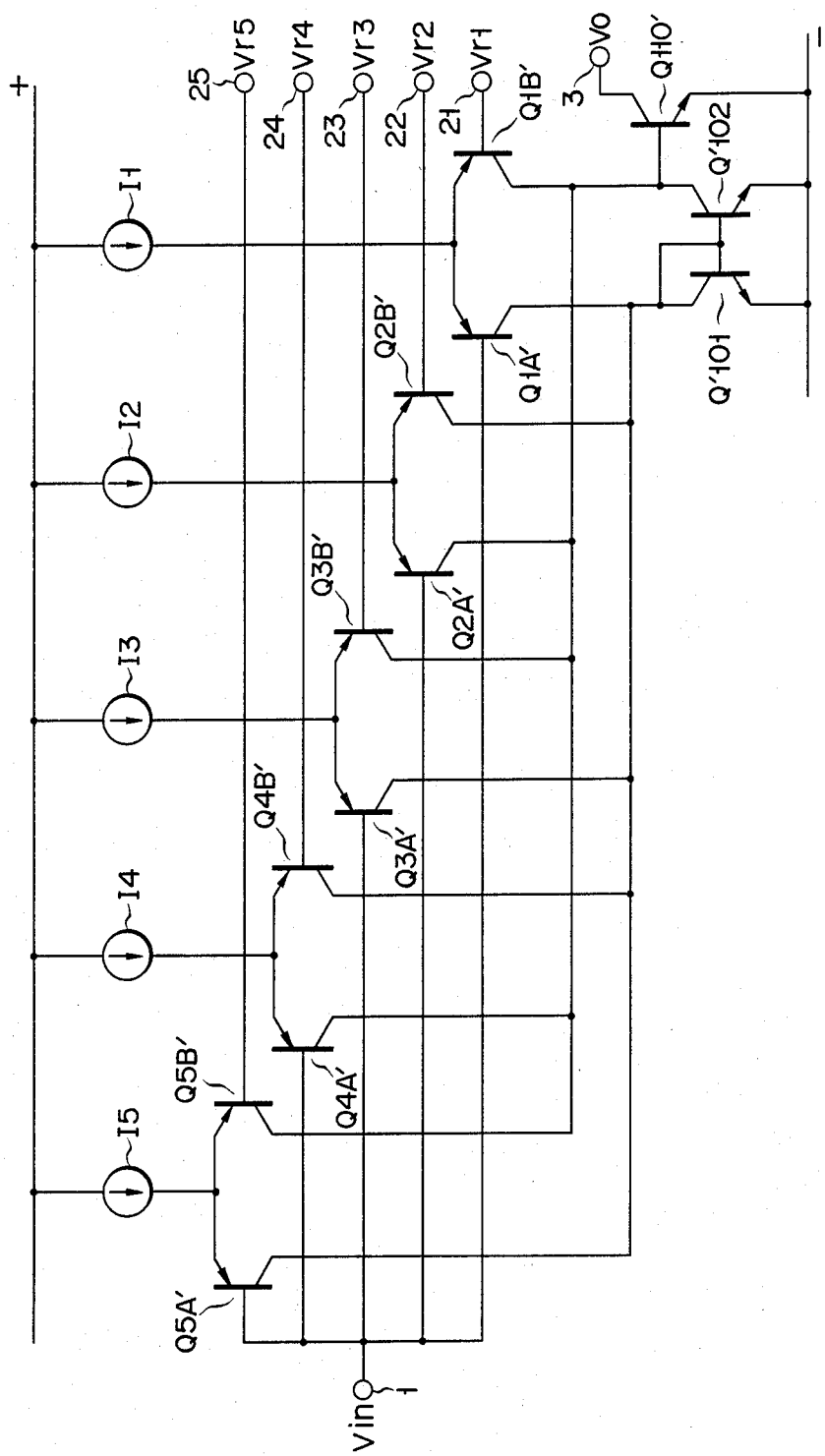
FIG. 8 is a circuit diagram of a voltage comparator circuit of pnp transistor input type having 5 inverting voltage levels in accordance with still another embodiment of the present invention.

Referring to FIG. 7, similar parts to those in FIG. 1 are designated by the same reference numerals with primes. Similarly, FIG. 8 shows a voltage comparator circuit obtained by inverting the polarities of the circuit shown in FIG. 3. Referring to FIG. 8, similar parts to those in FIG. 3 are designated by the same reference numerals with primes.

FIG. 9 shows the relationship between the input voltage Vin and the output voltage Vo. The output voltage Vo is inverted up to 5 times when the input voltage exceeds Vr1 to Vr5, respectively. Thus, the overall circuit shown in FIG. 9 functions as an inverter.

In the embodiments described above, all the transistors are bipolar transistors. However, the circuits shown in FIGS. 1, 3, 7 and 8 operate in the same manner even if the transistors are replaced by MOS transistors. Note that the polarities of the MOS transistors and power sources may be inverted.

Figure 10:
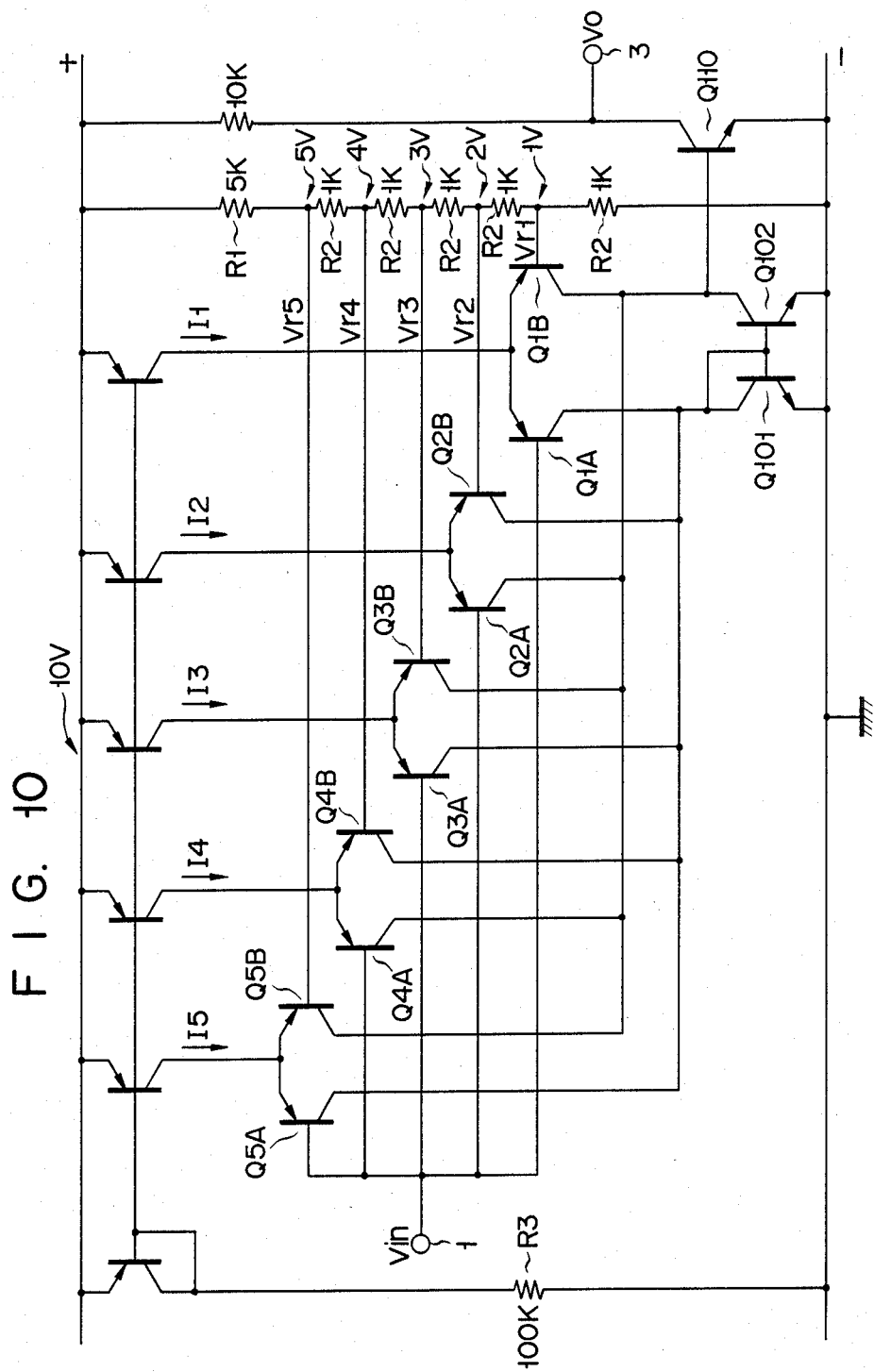
FIG. 10 is a circuit diagram of an experimental circuit corresponding to that shown in FIG. 8.

In order to test the operation of the circuit of the present invention as described above, an experimental circuit as shown in FIG. 10 was implemented. The circuit shown in FIG. 10 is a voltage comparator circuit of pnp transistor input type having 5 inverting levels. The same reference numerals in FIG. 10 denote the same parts in FIG. 8. The test conditions were set as follows: the first power source+was 10 V, the second power source—was ground potential, the resistor R1=5kΩ, resistor R2=1 kΩ, Vr1=1 V, Vr2=2 V, Vr3=3 V, Vr4=4 V, Vr5=5 V, R3=100 kΩ, I1=I2=I4=I5=100 μA, and the input voltage Vin was a triangular wave varying within the range of 0.4 to 5.6 V. It was confirmed that even if the period of the triangular wave was changed within the range of 10 ms to 10 μs, the circuit shown in FIG. 10 would operate stably with the input/output transmission characteristics as shown in FIG. 9. Unstable operation, such as oscillation during the rise or fall time of the output wave, was not observed.

In summary, a voltage comparator circuit of the present invention has an odd number, 3 or greater, of inverting voltages, performs a logic function as an inverter as a whole, and operates stably with a single output. A voltage comparator circuit having these features may be applied in a variety of fields. For example, if a triangular input wave is inverted at three points, a pulse output having a period ⅓ of the original period can be obtained. Similarly, if a triangular input wave is inverted at 5 points, a pulse output having a period 1/5 of the original period can be obtained. In this manner, a voltage comparator circuit of the present invention may be applied to a pulse frequency multiplier. With a voltage comparator circuit of the present invention, the input voltage is divided into an even number of regions by an odd number of inverting voltages. The level of the output voltages differs depending upon whether the input voltage is within an odd- or even-numbered region. Therefore, the voltage comparator circuit of the present invention may be applied to a detector of input voltage regions.

What is claimed is:

1. A voltage comparator circuit comprising:
   an input terminal for receiving an input voltage;
   an odd-number of reference voltage terminals for receiving an odd-number of different reference voltages, respectively;
   an odd-number of pairs of differential transistors each having one control electrode and first and second terminals, the control electrodes of the differential transistors of each pair being connected to said input terminal and the corresponding reference voltage terminal and the first terminals of the differential transistors of each pair being connected to each other, forming a node;
   an odd-number of constant current sources provided for the pairs of differential transistors, respectively, each of said constant current sources being connected to the node of the differential transistors of the corresponding pair;
   a first load circuit connected to the second terminal of the differential transistor of each odd-numbered pair whose control electrode is connected to said input terminal and the second terminal of the differential transistor of each even-numbered pair whose control electrode is connected to the corresponding reference voltage terminal;
   a second load circuit connected to the second terminal of the differential transistor of each even-numbered pair whose control electrode is connected to said input terminal and the second terminal of the differential transistor of each odd-numbered pair whose control electrode is connected to the corresponding reference voltage terminal; and
   an output transistor which is connected to said second load circuit and is driven by an output delivered from the second terminal of any differential transistor which is connected to said second load circuit.

2. A circuit according to claim 1, wherein the transistors whose second terminals are connected to one of the load circuits and whose control electrodes are connected to said input terminal are multiemitter transistors.

3. A circuit according to claim 1, wherein said first and second load circuits are a primary side transistor and a secondary side transistor which form a current mirror circuit, and the control electrode of said output transistor is connected to the second terminal of said secondary side transistor.

4. A circuit according to claim 1, wherein substantially the same current flows through said constant current sources.

* * * * *